United States Patent
Wan

(10) Patent No.: US 10,740,279 B2
(45) Date of Patent: Aug. 11, 2020

(54) COMPUTER SYSTEM AND MOTHERBOARD THEREOF

(71) Applicant: ASUSTEK COMPUTER INC., Taipei (TW)

(72) Inventor: Li-Chien Wan, Taipei (TW)

(73) Assignee: Asustek Computer Inc., Taipei (TW)

( * ) Notice: Subject to any disclaimer, the term of this patent is extended or adjusted under 35 U.S.C. 154(b) by 0 days.

(21) Appl. No.: 16/054,134

(22) Filed: Aug. 3, 2018

(65) Prior Publication Data

US 2019/0042531 A1 Feb. 7, 2019

(30) Foreign Application Priority Data

Aug. 3, 2017 (CN) .......................... 2017 1 0655972

(51) Int. Cl.
| | |
|---|---|
| H05K 1/00 | (2006.01) |
| G06F 15/78 | (2006.01) |
| H05K 1/14 | (2006.01) |
| H05K 1/02 | (2006.01) |
| H05K 1/11 | (2006.01) |

(52) U.S. Cl.
CPC ....... *G06F 15/7803* (2013.01); *H05K 1/0243* (2013.01); *H05K 1/14* (2013.01); *H05K 1/113* (2013.01); *H05K 1/114* (2013.01); *H05K 2201/09227* (2013.01); *H05K 2201/09772* (2013.01); *H05K 2201/10159* (2013.01); *H05K 2201/10189* (2013.01)

(58) Field of Classification Search
CPC .................. H05K 3/3452; H05K 1/144; H01L 2924/3011; H01L 2224/48091
See application file for complete search history.

(56) References Cited

U.S. PATENT DOCUMENTS

| | | | | |
|---|---|---|---|---|
| 5,303,121 A * | 4/1994 | Thornberg | ............. | H05K 1/141 174/255 |
| 6,072,699 A * | 6/2000 | Horine | ..................... | G11C 5/04 174/261 |
| 6,900,992 B2 * | 5/2005 | Kelly | ................... | H05K 1/0233 361/780 |
| 7,282,649 B2 * | 10/2007 | Murata | ................ | H05K 1/0248 174/261 |

(Continued)

OTHER PUBLICATIONS

EPO, Search Report, dated Jan. 8, 2019, 6 pages.

*Primary Examiner* — Pete T Lee
(74) *Attorney, Agent, or Firm* — Muncy, Geissler, Olds & Lowe, P.C.

(57) ABSTRACT

A motherboard includes a multilayer printed circuit board (PCB), a central processing unit (CPU) slot, at least one first memory slot, at least one second memory slot, a plurality of first traces, and a plurality of second traces. The CPU slot, the first memory slot, and the second memory slot are disposed on the first wiring layer of the multilayer PCB, and the second memory slot is disposed between the first memory slot and the CPU slot. The first traces are disposed on the first wiring layer of the multilayer PCB. The CPU slot is electrically connected to the first memory slot by the first traces. The second traces are disposed on the second wiring layer of the multilayer PCB which is different from the first wiring layer, and the CPU slot is electrically connected with the second memory slot by the second traces.

6 Claims, 6 Drawing Sheets

(56) References Cited

U.S. PATENT DOCUMENTS

| | | | |
|---|---|---|---|
| 8,422,245 B2* | 4/2013 | Tan | G06F 1/185 |
| | | | 361/736 |
| 2002/0015290 A1* | 2/2002 | Reniers | H01R 9/096 |
| | | | 361/736 |
| 2004/0221106 A1* | 11/2004 | Perego | G06F 13/409 |
| | | | 711/115 |
| 2007/0128896 A1 | 6/2007 | Willis | |
| 2013/0016466 A1 | 1/2013 | Yen et al. | |
| 2014/0063765 A1* | 3/2014 | Kashiwakura | H04Q 1/15 |
| | | | 361/782 |

* cited by examiner

US 10,740,279 B2

COMPUTER SYSTEM AND MOTHERBOARD THEREOF

CROSS-REFERENCE TO RELATED APPLICATION

This application claims the priority benefit of Chinese application serial No. 201710655972.8, filed on Aug. 3, 2017. The entirety of the above-mentioned patent application is hereby incorporated by reference herein and made a part of specification.

BACKGROUND OF THE INVENTION

Field of the Invention

The invention relates to a computer system and a motherboard thereof and, more particularly, to a computer system and a motherboard with a multilayer PCB.

Description of the Related Art

A motherboard is a main part of a complex electronic system, such as a computer. A printed circuit board (PCB) is an important electronic element of a motherboard for mounting electronic components. As shown in FIG. 1, a conventional motherboard 10 includes a central processing unit (CPU) slot 12, a chipset 14, memory slots 16A, 16B (take two channels and two memory slots for each channel for example) and at least one expansion slot 18 (such as PCI-E slot).

Types of the printed circuit board include a single-sided board, a double-sided board, or a multilayer board used according to different electronic devices and equipment functions. Nowadays, a motherboard commonly uses four to eight layers of multilayer board to provide enough wring area. FIG. 2 is a sectional schematic showing a four-layer PCB. As shown, the four-layer circuit board 20 includes four conducting layers from top to bottom: a top wiring layer 22, a power layer 24, a grounding layer 26, and a bottom wiring layer 28. The conducting layers are separated by baseboards or adhesive layers. The top wiring layer 22 is connected to the bottom wiring layer 28 by vias (not shown in the figure) passing through the circuit board to transmit signal.

Generally speaking, signal transmitting of the motherboard is easily effected by transmitting distances and connecting interfaces between different layers (such as the connecting interfaces of routings and vias on each layer) and then generates noises and mistakes, especially for transmitting high frequency signals (such as the signals transmitted between the CPU and the memory slot).

There are multiple types of touch panels, and nowadays, a resistive touch panel is the most popular. The operating principle of the resistive touch panel is illustrated hereinbelow.

BRIEF SUMMARY OF THE INVENTION

A motherboard is provided. The motherboard, comprises a multilayer printed circuit board (PCB), a central processing unit (CPU) slot, a first memory slot, a second memory slot, a plurality of first traces, and a plurality of second traces.

The CPU is disposed on a first wiring layer of the multilayer PCB. The first memory slot is disposed on the first wiring layer of the multilayer PCB. The second memory slot is disposed between the first memory slot and the CPU slot on the first wiring layer of the multilayer PCB.

The plurality of first traces are disposed in the first wiring layer of the multilayer PCB, and the CPU slot is electrically connected with the first memory slot by the first traces. The plurality of second traces are disposed in a second wiring layer of the multilayer PCB which is different from the first wiring layer, and the CPU slot is electrically connected with the second memory slot by the second traces.

A computer system is provided. The computer system comprises a central processing unit (CPU), at least one memory, and a motherboard. The motherboard comprises a multilayer printed circuit board (PCB), a central processing unit (CPU) slot, a first memory slot, a second memory slot, a plurality of first traces, and a plurality of second traces.

The central processing unit (CPU) slot is disposed on a first wiring layer of the multilayer PCB for mounting the CPU. The first memory slot and a second memory slot are disposed on the first wiring layer of the multilayer PCB, for mounting the memory, and the second memory slot disposed between the first memory slot and the CPU slot. The plurality of first traces are disposed in the first wiring layer of the multilayer PCB. The CPU slot is electrically connected with the first memory slot by the first traces. The plurality of second traces are disposed in a second wiring layer of the multilayer PCB which is different from the first wiring layer. The CPU slot is electrically connected with the second memory slot by the second traces.

These and other features, aspects and advantages of the present invention will become better understood with regard to the following description, appended claims, and accompanying drawings.

DETAILED DESCRIPTION OF THE EMBODIMENTS

Figure 1:
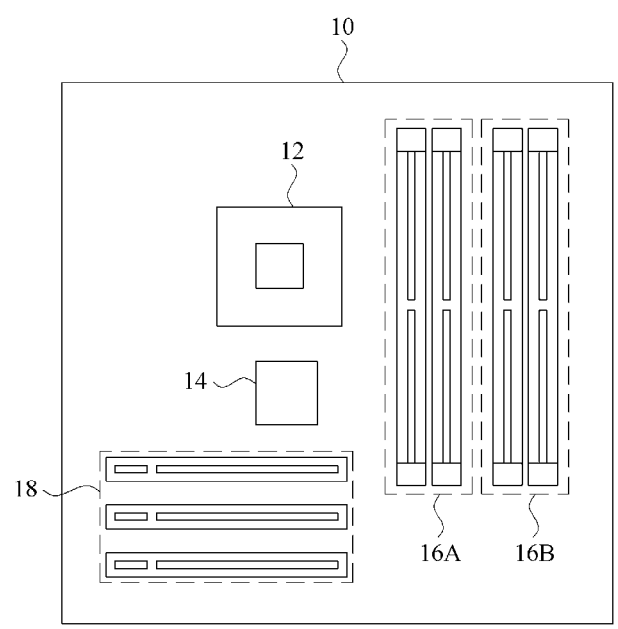
FIG. 1 is a block diagram showing a conventional motherboard.
Figure 2:
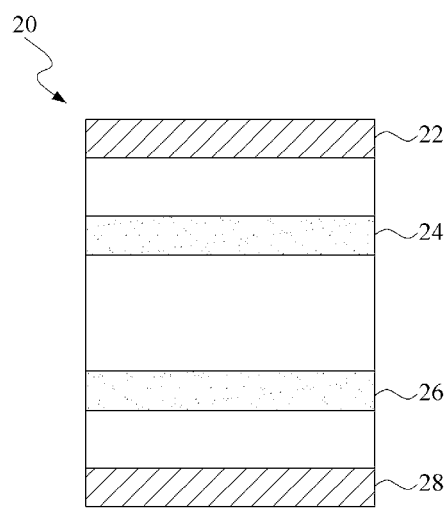
FIG. 2 is a sectional view showing a conventional four-layer circuit board.
Figure 3A:
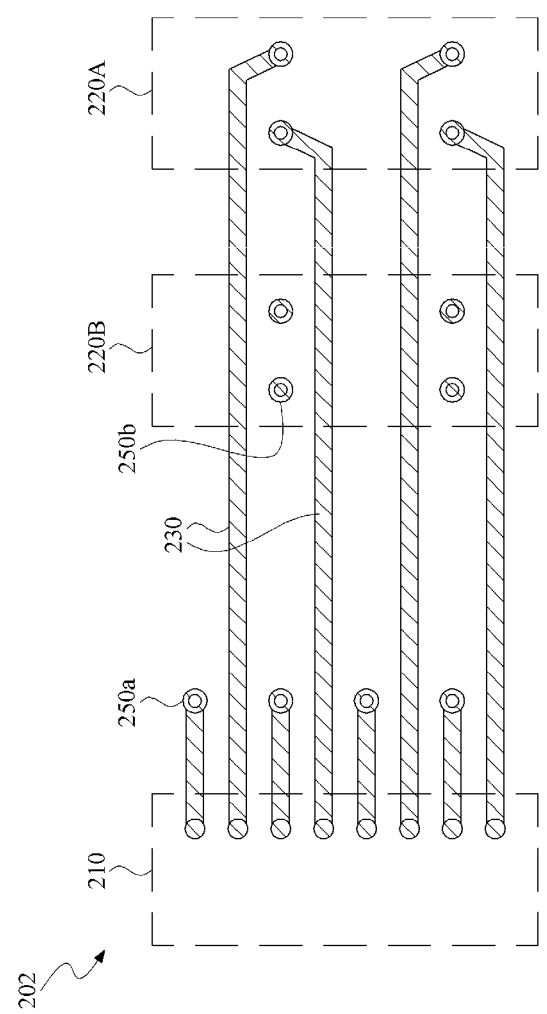
FIG. 3A, FIG. 3B, and FIG. 3C are a top view, a sectional view, and a bottom view of a motherboard respectively in an embodiment.
Figure 3B:
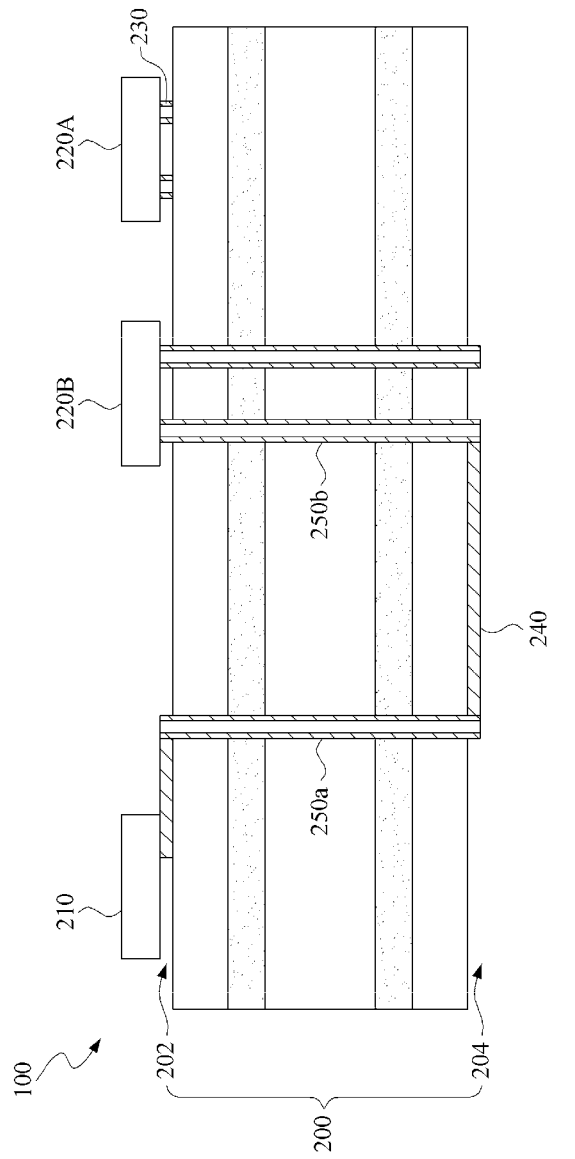
Figure 3C:
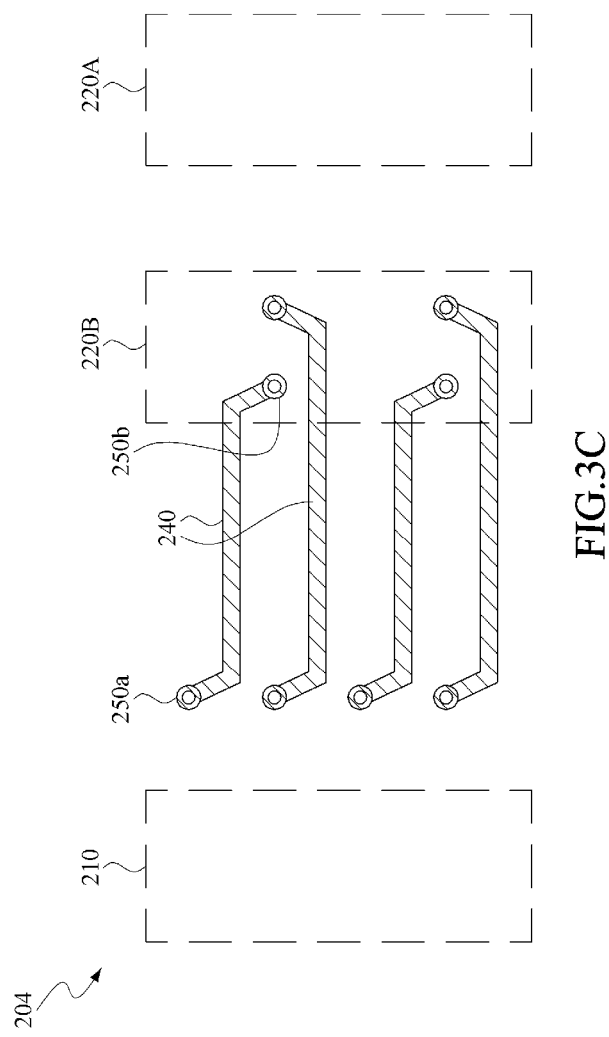

FIG. 3A is a top view of a motherboard 100 in an embodiment. FIG. 3B is a sectional view corresponding to a routing position in FIG. 3A. FIG. 3C is a bottom view of the motherboard 100. Slots of the motherboard are removed from FIG. 3A to show connecting points and routings beneath the slots.

As shown, the motherboard includes a multilayer printed circuit board (PCB) 200 (shown as a four-layer circuit board in the figure), a central processing unit (CPU) slot 210, a first memory slot 220A, a second memory slot 220B, a plurality of first traces 230, and a plurality of second traces 240.

The first memory slot 220A and the second memory slot 220B are shown in the figures, but which is not limited herein. In an embodiment, the motherboard includes dual-channel memories or a single channel memory, and each of the channels includes a single slot or two slots. That is to say, a motherboard with dual-channel and two slots for each channel includes two first memory slots 220A and two second memory slots 220B corresponding to different channels.

The CPU slot 210 is disposed on a first wiring layer 202 of the multilayer PCB 200. The first memory slot 220A and the second memory slot 220B are also disposed on the first wiring layer 202 of the multilayer PCB 200, and the second memory slot 220B is disposed between the first memory slot 220A and the CPU slot 210.

The first memory slot 220A and the second memory slot 220B are DDR4 memory slots in an embodiment. The first memory slot 220A and the second memory slot 220B are other types of the memory slot in other embodiments, and furthermore, the first memory slot 220A and the second memory slot 220B are different types of the memory slot in an embodiment.

The first traces 230 are disposed in the first wiring layer 202 of the multilayer PCB 200. The CPU slot 210 is electrically connected to the first memory slot 220A by the first traces 230. The second traces 240 are disposed in the second wiring layer 204 of the multilayer PCB 200. The second wiring layer 204 is different from the first wiring layer 202.

The CPU slot 210 is electrically connected to the second memory slot 220B by the second traces 240. In an embodiment, the first wiring layer 202 is a top layer of the multilayer PCB 200, and the second wiring layer 204 is a bottom layer of the multilayer PCB 200. For a multilayer PCB with six or eight layers, the second wiring layer 204 is a bottom layer or a middle layer of the multilayer PCB 200.

As shown in FIG. 3B and FIG. 3C, two ends of second traces 240, which is disposed in the second wiring layer 204 of the multilayer PCB 200, are electrically connected with the CPU slot 210 and the second memory slot 220B disposed on the first wiring layer 202 respectively through the vias 250a, 250b passing through the multilayer PCB 200.

That is to say, the routing extending from the CPU slot 210 to the second memory slot 202 twice changes path between different layers. Furthermore, in an embodiment, the via 250b connects to the second memory slot 220B directly, that is to say, the memory in the second memory slot 220B is connected to the via 250b without any other routing on the first wiring layer 202.

In an embodiment, the via 250a connects to the CPU slot 210 through a section of the routing on the first wiring layer 202, instead of directly connecting to the CPU slot 210. In an embodiment, the via 250b connects to the second memory slot 220B through a section of the routing on the first wiring layer 202, and the via 250a connects to the CPU slot 210 directly, instead of that through a section of the routing on the first wiring layer 202.

In comparison, as shown in FIG. 3A and FIG. 3B, the multiple first traces 230 in the first wiring layer 202 of the multilayer PCB 200 directly extend to the first memory slot 220A without changing path between the layers or passing any via. In an embodiment, the first traces 230 pass beneath the second memory slot 220B to directly extend to the first memory slot 220A to shorten the routing distance. In an embodiment, in order to meet the designing requirements or overcome the routing space limitation of the motherboard, the first traces 230 pass around the second memory slot 220B to extend to the first memory slot 220A.

FIG. 3A and FIG. 3B are not drawn according to an actual size. Actually, the thickness of the multilayer PCB 200 (corresponding to the length of vias in the embodiment) is much less than the distance between the CPU slot 210 and the first memory slot 220A or between the CPU slot 210 and the second memory slot 220B. In an embodiment, the thickness of a four-layer circuit board is about 1 mm to 2 mm. Therefore, the routing changing between the layers does not obviously increase a signal transmitting distance.

Generally speaking, signal transmission of the motherboard is easily affected by connecting interfaces between different layers and then generates noises and mistakes. For a motherboard using a multilayer PCB, it is unavoidable that the routing changes between different layers (especially for the signal transmitted between a CPU and a memory). In the embodiment, it is avoided that signals transmitting among different layers of the motherboard 100 generate too many noises and mistakes due to a long transmitting distance and influence the compatibility of the memory. Therefore, the signals transmitted in the same layer avoid noises or compatibility problem.

Figure 4:
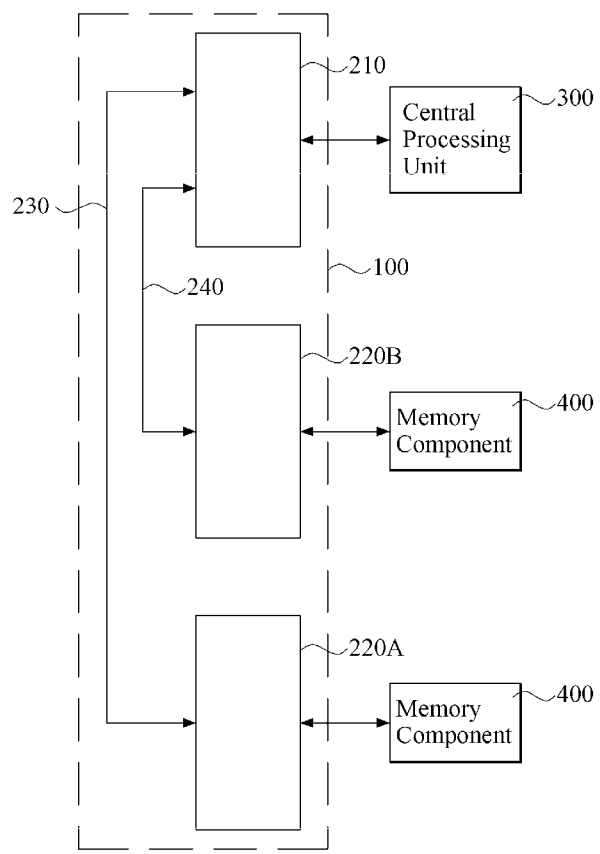
FIG. 4 is a block diagram of a computer system in an embodiment.

Please refer to FIG. 4. In an embodiment, a computer system utilizes the motherboard mentioned before. the computer system includes a central processing unit (CPU) 300, at least a memory component 400 (two memory components 400 corresponding to the first memory slot 220A and the second memory slot 220B respectively are shown in the figure.), and the motherboard 100. a CPU 300 is disposed in the CPU slot 210, the memory components 400, which are memory cards, are disposed in the first memory slot 220A and the second memory slot 220B respectively to do computations.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:
1. A motherboard, comprising:
a multilayer printed circuit board (PCB) having a top side and a bottom side, a first wiring layer disposed on the top side and a second wiring layer disposed on the bottom side;
a central processing unit (CPU) slot, disposed on the first wiring layer of the multilayer PCB;
a first memory slot, disposed on the first wiring layer of the multilayer PCB;
a second memory slot, disposed between the first memory slot and the CPU slot on the first wiring layer of the multilayer PCB;
a plurality of first traces, disposed externally on a top surface of the first wiring layer of the multilayer PCB, and the CPU slot electrically connected with the first memory slot by the first traces; and
a plurality of second traces, disposed externally on a bottom surface of the second wiring layer of the multilayer PCB which is different from the first wiring layer, and the CPU slot electrically connected to the second memory slot by the second traces;
wherein the second wiring layer is below the first wiring layer;
wherein the second traces are electrically connected with the CPU slot through first vias and a section of routing on the first wiring layer, and the second memory slot through second vias.
2. The motherboard according to claim 1, wherein the first memory slot and the second memory slot correspond to different channels.

3. The motherboard according to claim 1, wherein the first traces pass through the second memory slot and extend from the CPU slot to the first memory slot.

4. A computer system, comprising:
- a central processing unit (CPU);
- at least one memory; and
- a motherboard, comprising:
  - a multilayer printed circuit board (PCB) having a top side and a bottom side, a first wiring layer disposed on the top side and a second wiring layer disposed on the bottom side;
  - a central processing unit (CPU) slot, disposed on the first wiring layer of the multilayer PCB for mounting the CPU;
  - a first memory slot and a second memory slot, disposed on the first wiring layer of the multilayer PCB, for mounting the memory, and the second memory slot disposed between the first memory slot and the CPU slot;
  - a plurality of first traces, disposed externally on a top surface of the first wiring layer of the multilayer PCB, and the CPU slot electrically connected with the first memory slot by the first traces; and
  - a plurality of second traces, disposed externally on a bottom surface of the second wiring layer of the multilayer PCB which is different from the first wiring layer, and the CPU slot electrically connected with the second memory slot by the second traces;
  - wherein the second wiring layer is below the first wiring layer;
  - wherein the second traces are electrically connected with the CPU slot through first vias and a section of routing on the first wiring layer, and the second memory slot through second vias.

5. The computer system according to claim 4, wherein the first memory slot and the second memory slot correspond to different channels.

6. The computer system according to claim 4, wherein the first traces pass through the second memory slot and extend from the CPU slot to the first memory slot.

* * * * *